United States Patent [19]

Shoji

[11] Patent Number: 4,488,066
[45] Date of Patent: Dec. 11, 1984

[54] DATABUS COUPLING ARRANGEMENT USING TRANSISTORS OF COMPLEMENTARY CONDUCTIVITY TYPE

[75] Inventor: Masakazu Shoji, Warren, N.J.

[73] Assignee: AT&T Bell Laboratories, Murray Hill, N.J.

[21] Appl. No.: 439,938

[22] Filed: Nov. 8, 1982

[51] Int. Cl.³ .................. H03K 19/017; H03K 19/096
[52] U.S. Cl. .................................... 307/452; 307/443; 307/480; 307/475
[58] Field of Search ................ 307/443, 473, 451–453, 307/480, 576, 579, 583, 585, 475, 264, 269; 365/203

[56] References Cited

U.S. PATENT DOCUMENTS

| | | | |
|---|---|---|---|
| 3,976,984 | 8/1976 | Hirasawa | 307/452 X |
| 4,045,684 | 8/1977 | Eads et al. | 307/443 X |
| 4,389,582 | 6/1983 | Suzuki et al. | 307/452 |

OTHER PUBLICATIONS

Mead and Conway, Introduction to VLSI Systems, Addison-Wesley Pub. Co., Reading, Mass., Oct., 1980, pp. 156-157.

Primary Examiner—Stanley D. Miller
Assistant Examiner—David R. Hudspeth
Attorney, Agent, or Firm—Arthur J. Torsiglieri

[57] ABSTRACT

To improve the speed of transfer of information to the databus in data processing apparatus, the bus is periodically precharged and the coupling to the databus is by way of a special clocked CMOS buffer circuit.

9 Claims, 3 Drawing Figures

DATABUS COUPLING ARRANGEMENT USING TRANSISTORS OF COMPLEMENTARY CONDUCTIVITY TYPE

TECHNICAL FIELD

This relates to integrated circuits useful in data processing and more particularly in microprocessor apparatus.

BACKGROUND OF THE INVENTION

In data processing apparatus such as microprocessors, it is usual to include one or more databuses which serve for the transmission of data streams between the various parts of the apparatus.

As such apparatus becomes more complex and more and more circuits are loaded on a particular databus, the loading of the databus increases and the demand on the components driving the databus increases. At the same time such components are decreasing in size and less able to handle demanding loads with the high speeds that are important for state of the art data processing apparatus.

SUMMARY OF THE INVENTION

To solve this problem it is proposed to operate a databus in a precharged mode to improve the speed with which a signal pulse can be impressed on the databus without increasing the drive needed by the driver to impress such pulse. Precharging of output nodes in logic networks and in sense amplifiers of memory bit lines has become standard practice in high speed data processing apparatus but has been little used in microprocessors because of the complexity it could be expected to introduce in the system timing. In those instances where a precharging has been employed, the circuit becomes noisesensitive, and it has tended to be unreliable. Instead the data stream has been introduced into the databus in the typical microprocessor by way of a simple tristable buffer.

In accordance with my invention, a novel dynamic coupling circuit is provided at each node where coupling data into the databus is to occur and these circuits cooperate with a common dynamic precharging transistor. In a preferred embodiment, the coupling network includes a complementary pair of clocked tristate drivers cooperating with a single clocked precharge transistor to provide a high-speed pull-down driver cooperating with a pull-up precharging transistor.

BRIEF DESCRIPTION OF THE DRAWING

Each of FIGS. 1 and 2 of the drawing shows an illustrative embodiment of the invention useful in coupling a data stream developed by a logic network to a databus.

DETAILED DESCRIPTION

Figure 1:
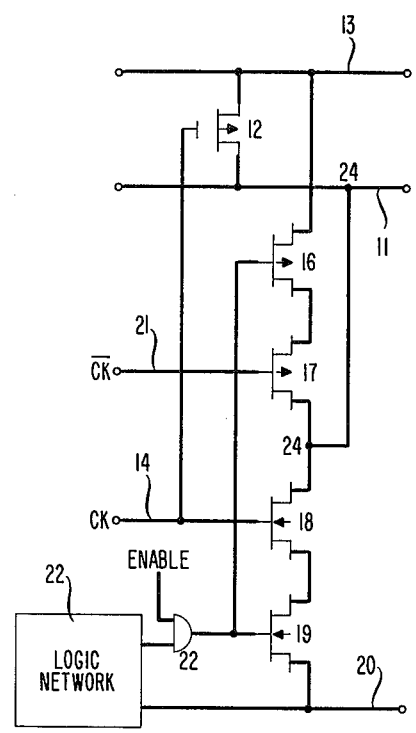

With reference now to the drawing, in FIG. 1 a databus 11 is included in a microprocessor typically as a conductive layer extending on the surface of a silicon chip within which are housed the various transistors which form the circuits which make up the microprocessor.

A precharge p-type transistor 12 is used to charge the databus periodically to the high voltage associated with the higher output state of the two binary signal states which the databus can assume, which in a CMOS device typically are the voltage on the two opposite sides of the power supply. It will be assumed that all the transistors described are of the enhancement mode type.

Transistor 12 has its source connected to the power bus 13 which is at the high potential $V_{DD}$ of the power supply associated with the microprocessor. The drain of transistor 12 is connected to the databus and its gate electrode to a line 14 to which are applied the clock pulses used to control the databus transaction. The application of a low clock pulse to the gate electrode permits the databus to be charged essentially to $V_{DD}$. The transistor 12 is designed to have a relatively large beta, the ratio of channel width to channel length, so that it can pull the databus up to $V_{DD}$ quickly.

At each of the nodes where data are to be introduced to the databus, there is provided a dynamic coupling network comprising p-type transistors 16 and 17 and n-type transistors 18 and 19, all connected to have their main conductive channels serially connected between the high and low power buses 13,20 of the power supply of the microprocessor. P-type transistor 17 has its gate supplied by a line 21 which supplies the complement of the clock pulses on line 14. N-type transistor 18 has its gate connected to line 14 which provides true clock pulses to it. The gates of p-type transistor 16 and n-type transistor 19 are each supplied with the output of the AND gate 22, one of whose inputs is the data stream which is provided by the logic network 23 and which is to be transferred to the databus 11. The other input to the AND gate 22 is an enabling pulse from a control circuit (not shown) which controls when the data stream from logic network 23 is to be applied to the databus. The node 24 between transistors 17 and 18 forms the coupling node to the databus 11.

In operation, when the clock line is low, p-type transistor 12 will be conducting, but p-type transistor 17 and n-type transistor 18 will be nonconducting so that the databus will approach the voltage of $V_{DD}$, essentially independent of the input to transistors 16 and 19. When the clock goes high, p-type transistor 12 will be nonconducting, p-type transistor 17 and n-type transistor 18 will be conducting, and whether the databus remains at $V_{DD}$ or will be pulled down close to the potential of the low potential bus 20 of the power supply, typically ground, will depend on the value of the input to the transistors 16 and 19. When this input is high, which requires both an enabling pulse and a "one" at the output of the logic network, n-type transistor 19 will conduct but p-type transistor 16 will not conduct, permitting node 24 and the databus to approach the ground potential of the low potential bus 20 of the power supply. However, when this input is low, n-type transistor 19 will not conduct but p-type transistor 16 will conduct, thereby maintaining node 24 and the databus essentially at the potential $V_{DD}$ of the high potential bus 13 of the power supply.

For this arrangement to be competitive with alternative arrangements, it is important that the coupling arrangement permit speedy transfer of data to the databus and, accordingly, it is advantageous that the capacitance added to the databus by the precharge and coupling circuits be small. This is achieved by appropriately choosing the betas of the various transistors used. In particular, since only one precharge transistor 12 is needed for each databus, it is tolerable to utilize a transistor of relatively large beta for this role. However, there will be at each coupling node a coupling arrangement of the kind described so that the ability to use transistors of smaller betas is important here. In particular, since the speed and current handling capacities of p-type transistors 16,17 are relatively unimportant, each is designed to have a small beta, typically about one sixth that of transistor 12. However, p-type transistors 16 and 17 are important to keep the databus connected to the positive bus 13 of the power supply by way of a finite impedance to reduce noise induction from the power bus, and to prevent accidental discharge of the bus. If the noise induction is small, the betas of transistors 16 and 17 can be small. On the other hand, the speed of the pair of n-type transistors 18 and 19 should preferably be comparable to those of transistor 12 and, accordingly, preferably each is designed to have a beta typically about that of transistor 12.

Figure 2:
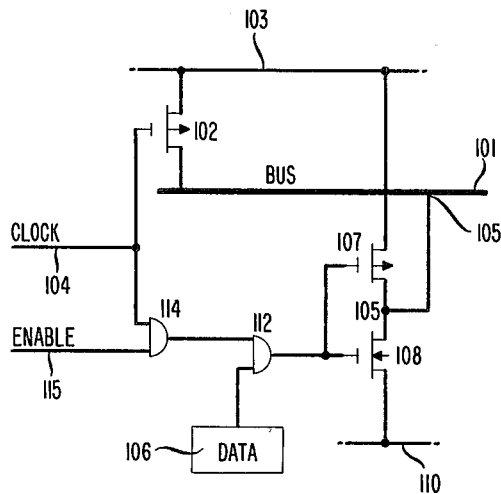

In FIG. 2, there is shown an alternative arrangement for coupling to a databus 101 in accordance with the invention. There is included a p-type precharging transistor 102 whose source is connected to the positive bus 103 of the power supply (not shown) and whose drain is connected to the databus. The gate is connected to a line 104 to which are applied the clock pulses. When the clock is low, transistor 102 conducts and the databus is charged essentially to the potential of the positive bus of the power supply.

At node 105 where data is to be transferred to the databus from the logic network 106, there is included an appropriate coupling network. This network comprises the p-type transistor 107 and n-type transistor 108 having their main conduction channels serially connected between the positive and negative buses 103 and 110, respectively, of the power supply. The node between the drain of transistor 107 and the drain of transistor 108 is connected to coupling node 105. The gates of transistors 107 and 108 are connected together and to the output of the AND gate 112. For reasons discussed before, preferably driver pull-up 107 should have a small beta while pull-down driver 108 should have a beta comparable to that of precharging transistor 102. AND gate 112 is supplied at one input with data from the logic network 106 and at the other input with the output of AND gate 114. This gate has as one input the clock from clock line 104 and as another input an enabling pulse from an enabling line 115 from a suitable control circuit (not shown) which provides an enabling pulse to AND gate 114 when data from network 106 is to be coupled to the databus.

In operation, when the clock is low, the outputs of both AND gates 112 and 113 are low, transistor 107 conducts, and transistor 108 is off. As a result the databus remains high. When the clock is high and an enabling pulse is supplied to AND gate 114, the output of the logic network determines the effect on the databus. When the output is low, there is no effect. When the output is high, transistor 108 conducts but transistor 107 is off whereby the databus is pulled down essentially to the low potential of power supply bus 110. It should be evident that the role of the two AND gates 112 and 114 can be combined in a single AND gate with three inputs: the clock pulse, the enabling pulse, and the data stream.

It should at this point be evident that a variety of other coupling arrangements can be provided at each of the nodes to couple controllably their data into the databus.

Figure 3:
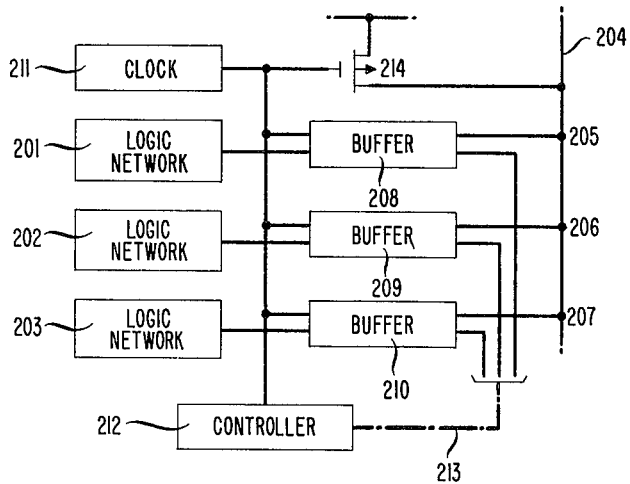
FIG. 3 shows a plurality of logic networks coupled to a common databus in accordance with the invention.

It is of course evident that, in a typical system, it will be important to couple the output of a plurality of logic networks to a common databus. FIG. 3 illustrates such an arrangement in which logic networks 201, 202, and 203 are coupled to a common databus 204 at nodes 205, 206, and 207, respectively. To this end there is inserted between the output of each logic network and its coupling node a coupling network or buffer 208, 209, or 210, of the kind described in connection with either FIG. 1 or FIG. 2. Each of the buffers is controlled by a common source of clock pulses 211 and a controller 212 which provides the enabling pulses which select the logic network to be effectively coupled to the databus at a particular time. Typically, the various logic networks will be connected sequentially in a prescribed order to the databus in successive clock cycles as indicated schematically by line 213. A single p-type transistor 214 under control of the clock pulses serves to precharge the databus for each of the coupling networks.

It can be appreciated that the databus is bidirectional in that pulses applied to the bus will propagate in both directions. However, each of the coupling arrangements is asymmetric in that pulses applied to the databus at one node will not transfer out by way of a coupling arrangement of the kind described at a different node. It would be, of course, feasible to design a coupling arrangement which would be symmetric if this were desired for some special purpose.

What is claimed is:

1. In data processing apparatus, an arrangement for transferring data streams from a plurality of logic networks to a common databus comprising,
   a databus means under the control of a source of clock pulses for periodically precharging the databus essentially to the potential of one of two power supply terminals,
   a plurality of logic networks, each for supplying a data stream to be transferred to the databus,
   and a plurality of coupling networks, one associated with each logic network, each coupling network being connected between the two terminals of the power supply, including an output node for connection to the databus, and supplied with clock pulses and selection pulses whereby the data stream from its associated logic network may be periodically selected for transmission to the databus,
   characterized in that the coupling network comprises at least one pair of transistors of complementary conductivity type serially connected between the two terminals of the power supply and in that the node between the two transistors is the output node for connection to the databus.

2. An arrangement in accordance with claim 1 in which the coupling means comprises only a single pair of transistors of complementary conductivity type having their channels connected in series and in which the gates of the two transistors are controlled by the output of the logic network and the clock and selection pulses.

3. An arrangement in accordance with claim 1 in which the precharging means includes a p-type transistor of relatively large beta and the transistors of complementary conductivity type include a p-type pull-up driver of relatively small beta and an n-type pull-down driver of relatively large beta.

4. An arrangement in accordance with claim 1 in which the coupling network comprises two pairs of transistors of complementary conductivity type having their channels serially connected, having their gates controlled by the output of the logic network and the clock and selection pulses, and having the node between the two transistors of one type and the two transistors of the opposite type forming the connection to the databus.

5. An arrangement in accordance with claim 4 in which one of the transistors of each type is under the control of clock pulses and the other of each type is under the control of the output of the logic network and a selection pulse.

6. An arrangement in accordance with claim 5 in which the precharging means includes a p-type transistor of relatively large beta and the coupling network includes a pair of p-type transistors of relatively small betas and a pair of n-type transistors of relatively large betas.

7. In data processing apparatus, an arrangement for transferring a stream of data bits to a databus comprising means under the control of a source of clock pulses for periodically precharging the bus to one of two binary states, and a coupling network between the source of the stream of data bits and the databus comprising a first pair of transistors of one conductivity type serially connected and a second pair of transistors of the opposite conductivity type serially connected, the two pairs being serially connected between the first and second terminals of a power supply, the node between the two pairs being electrically connected to the databus, the gates of one transistor of each pair being connected to the source of the stream of data bits, the gate of the other transistor of the first pair being connected to the source of clock pulses and the gate of the other transistor of the second pair being connected to a source of the complement of the clock pulses.

8. The arrangement of claim 7 in which the precharging means includes a fifth transistor whose channel is connected between one of the terminals of the power supply and the databus and whose gate is connected to the source of clock pulses.

9. The arrangement of claim 7 in which the first pair of transistors are n-type, the second pair are p-type and the fifth transistor is p-type, and the second pair are of relatively small betas compared to the betas of the other transistors.

* * * * *